(12) United States Patent
Hatcher et al.

(10) Patent No.: US 11,475,933 B2
(45) Date of Patent: Oct. 18, 2022

(54) VARIATION MITIGATION SCHEME FOR SEMI-DIGITAL MAC ARRAY WITH A 2T-2 RESISTIVE MEMORY ELEMENT BITCELL

(71) Applicant: Samsung Electronics Co., Ltd., Gyeonggi-do (KR)

(72) Inventors: Ryan Hatcher, Austin, TX (US); Titash Rakshit, Austin, TX (US); Jorge Kittl, Garland, TX (US); Joon Goo Hong, Austin, TX (US); Dharmendar Palle, Austin, TX (US)

(73) Assignee: Samsung Electronics Co., Ltd

( * ) Notice: Subject to any disclaimer, the term of this patent is extended or adjusted under 35 U.S.C. 154(b) by 308 days.

(21) Appl. No.: 16/847,741

(22) Filed: Apr. 14, 2020

(65) Prior Publication Data

US 2021/0057011 A1 Feb. 25, 2021

Related U.S. Application Data

(60) Provisional application No. 62/889,883, filed on Aug. 21, 2019.

(51) Int. Cl.
| | |
|---|---|
| *G11C 11/16* | (2006.01) |
| *G06F 17/16* | (2006.01) |
| *G06F 17/17* | (2006.01) |
| *G06G 7/16* | (2006.01) |

(52) U.S. Cl.
CPC ........ *G11C 11/1659* (2013.01); *G06F 17/16* (2013.01); *G06F 17/17* (2013.01); *G06G 7/16* (2013.01); *G11C 11/1673* (2013.01)

(58) Field of Classification Search
CPC ............ G06F 17/16; G06F 17/17; G06G 7/16
See application file for complete search history.

(56) References Cited

U.S. PATENT DOCUMENTS

| | | | |
|---|---|---|---|
| 7,324,374 B2 * | 1/2008 | Shieh | ............ G11C 11/5642 365/210.1 |
| 9,472,256 B1 | 10/2016 | Andre | |
| 9,653,137 B2 | 5/2017 | Lee et al. | |
| 10,311,126 B2 | 6/2019 | Le Gallo et al. | |

(Continued)

FOREIGN PATENT DOCUMENTS

WO   WO-2018065233 A1 *  4/2018  ........... G01R 33/243

OTHER PUBLICATIONS

Agrawal, "Process variation in embedded memories failure analysis and variation aware architecture", IEEE Journal of Solid-State Circuits, vol. 40, Issue: 9, Sep. 2005, pp. 1804-1814 (Year: 2005).*

(Continued)

*Primary Examiner* — Michael D. Yaary
(74) *Attorney, Agent, or Firm* — The Farrell Law Firm, P.C.

(57) ABSTRACT

A method, system and electronic device for mitigating variance in a two transistor two resistive memory element (2T2R) circuit is provided. The method includes calculating a sum of a number of logical 1's in a column of bitcells in the 2T2R circuit, N, of an input vector, sensing output current values from each current line in the column of bitcells and calculating an inner product, M, of the input vector and the bitcells in the column in the 2T2R circuit based on the sensed output current values.

18 Claims, 4 Drawing Sheets

(56) References Cited

U.S. PATENT DOCUMENTS

| | | | |
|---|---|---|---|
| 2003/0128067 A1* | 7/2003 | Jaussi | G06G 7/16 |
| | | | 327/552 |
| 2015/0036409 A1 | 2/2015 | Jung et al. | |
| 2018/0144240 A1 | 5/2018 | Garbin et al. | |
| 2019/0019564 A1 | 1/2019 | Li et al. | |
| 2019/0102170 A1* | 4/2019 | Chen | G11C 11/419 |
| 2019/0130954 A1 | 5/2019 | Camsari et al. | |
| 2019/0131977 A1 | 5/2019 | Obradovic et al. | |
| 2019/0154493 A1 | 5/2019 | Hatcher et al. | |
| 2019/0180173 A1 | 6/2019 | Tomg et al. | |
| 2020/0311533 A1* | 10/2020 | Agrawal | H01L 27/2481 |

OTHER PUBLICATIONS

Chatterjee, "A methodology for yield-specific leakage estimation in memory", Proceedings of the IEEE 2014 Custom Integrated Circuits Conference, Nov. 2014 (Year: 2014).*

Chen, "Technology-design co-optimization of resistive cross-point array for accelerating learning algorithms on chip", 2015 Design, Automation & Test in Europe Conference & Exhibition (DATE), Apr. 2015 (Year: 2015).*

Ghodrati, "Mixed-Signal Charge-Domain Acceleration of Deep Neural networks through Interleaved Bit-Partitioned Arithmetic", arXiv :1906.11915v3 [cs.AR], https://doi.org/10.48550/arXiv.1906.11915, Jul. 2019 (Year: 2019).*

\* cited by examiner

… (US 11,475,933 B2)

VARIATION MITIGATION SCHEME FOR SEMI-DIGITAL MAC ARRAY WITH A 2T-2 RESISTIVE MEMORY ELEMENT BITCELL

PRIORITY

This application is based on and claims priority under 35 U.S.C. § 119(e) to U.S. Provisional Patent Application filed on Aug. 21, 2019 in the United States Patent and Trademark Office and assigned Ser. No. 62/889,883, the entire contents of which are incorporated herein by reference.

FIELD

The present disclosure is generally related to systems and methods for reducing degradation in inference accuracy in arrays based on a two transistor two resistive memory element (2T2R) circuit due to MTJ conductance variation.

BACKGROUND

There is increasing demand for hardware accelerators for machine learning (ML) applications. The computation that dominates many of these ML applications are matrix vector multiplications. While it is possible to efficiently perform bitwise matrix vector multiplication in analog through a crossbar network, in order to represent the weight, some kind of memory element should be introduced in each weight cell. However, static random-access memory (SRAM) is large and power inefficient. Further, nonvolatile memory options, such as resistive random-access memory (RRAM), FLASH, or spin-transfer torque (STT)-magnetoresistive random-access memory (MRAM) often suffer from a subset of other challenges including low on/off ratios, high variation and non-compatible programming voltages.

SUMMARY

In one embodiment, a method for mitigating variance in a 2T2R circuit includes calculating a sum of a number of logical 1's in a column of bitcells in the 2T2R circuit, N, of an input vector, sensing output current values from each current line in the column of bitcells and calculating an inner product, M, of the input vector and the bitcells in the column in the 2T2R circuit based on the sensed output current values.

In one embodiment, a system for mitigating variance includes a 2T2R circuit including a column of bitcells and at least two output current lines, a memory, and a processor configured to calculate a sum of a number of logical 1's in the column of bitcells in the 2T2R circuit, N, as an input vector, sense output current values from the at least two output current lines in the column of bitcells, and calculate an inner product, M, of the input vector and the bitcells in the column in the 2T2R circuit based on the sensed output current values.

In one embodiment, an electronic device includes a 2T2R circuit including a column of bitcells and at least two output current lines, a memory and a processor configured to calculate a sum of a number of logical 1's in the column of bitcells in the 2T2R circuit, N, as an input vector, sense output current values from the at least two output current lines in the column of bitcells and calculate an inner product, M, of the input vector and the bitcells in the column in the 2T2R circuit based on the sensed output current values.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
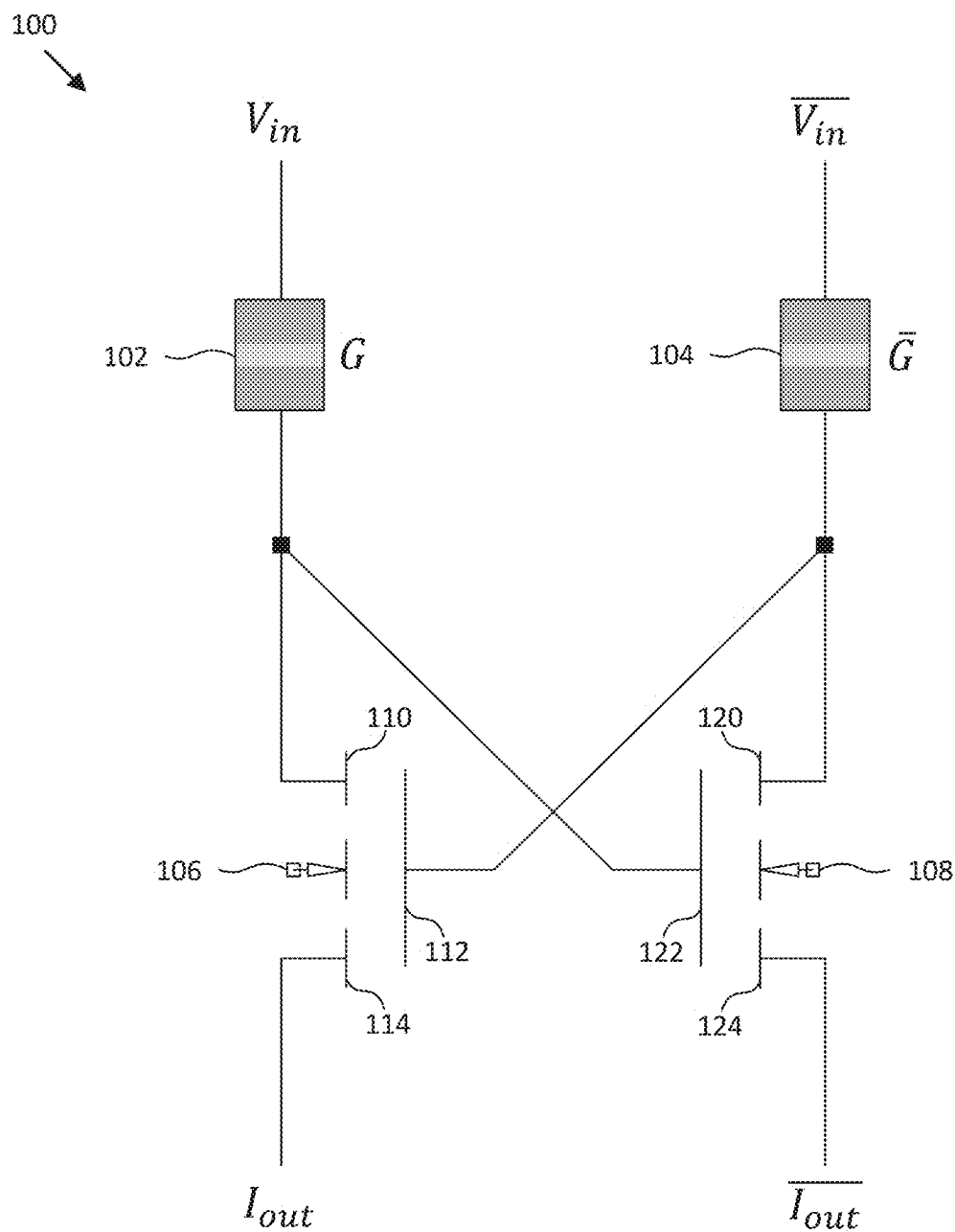
FIG. 1 illustrates a diagram of a weight cell, according to an embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "$1^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

According to an aspect of the disclosure, a system and method are provided to reduce degradation in inference accuracy in arrays based on a 2T2R bitcell due to the conductance variation present in many resistive memories. It is disclosed herein how to utilize both output lines that are intrinsic to the 2T2R bitcell. Outputs may be measured on both output lines and then averaged in such a way to reduce variation compared to measuring the output from only one line.

Although the descriptions below are given utilizing STT-MRAM (spin-torque transfer magnetic random access memory, utilizing magnetic tunnel junctions (MTJs)) memories as an example of a resistive memory, other non-volatile memory technologies having resistance variance may be utilized in place of the STT-MRAM, such as phase change memory (PCM), ferroelectric random access memory (Fe-RAM), and resistive random access memory (RRAM), etc. The transistors can be implemented alternatively with p-type field effect transistors. With PFETs, the polarities are all reversed for inference and writes.

The system and method minimizes the degradation in inference accuracy for semi-digital matrix vector multiplication accelerator architectures based on 2T2R bitcells.

FIG. 1 illustrates a diagram of a weight cell 100, according to an embodiment. A 2T-2MTJ bitcell may be used to store a weight in a neural network. The weight cell 100 includes a first magneto tunnel junction (MTJ) 102, a second MTJ 104, a first FET 106, and a second FET 108. The FETs 106 and 108 are depicted as n-type FETs (NFET), although p-type FETs may be utilized. The FET 106 includes a drain 110, a gate 112, and a source 114. Likewise, the FET 108 includes a drain 120, a gate 122, and a source 124. The weight cell 100 includes a cross coupling, such that the drain 110 of the FET 106 is connected to the gate 122 of the FET 108 and the drain 120 of the FET 108 is connected to the gate 112 of the FET 106.

The MTJ 102 has a conductance G while the MTJ 104 has a conductance $\overline{G}$. They are complementary in that one is placed in a high conductance state while the other is placed in a low conductance state, and wherein the status of the pair can be switched to the opposite state to indicate the opposite logical weight. The weight cell includes four independent external connections: the input $V_{in}$ to the MTJ 102, the input $\overline{V_{in}}$ the MTJ 104, a first output $I_{out}$ connected to the source 114 of the FET 106, and a second output $\overline{I_{out}}$ connected to the source 124 of the FET 108. Each MTJ 102 and 104 can be in one of two states, either a high conductance state $G_H$ or a low conductance state $G_L$. The cross coupling allows for a high on/off ratio of the outputs. The MTJs 102 and 104 have different conductance states and the configuration determines the logical value. For example, if the weight cell 100 has a logical value of 1, then $G=G_L$ and $\overline{G}=G_H$. Likewise, if the weight cell 100 has a logical value of 0, then $G=G_H$ and $\overline{G}=G_L$, as shown in Table 1.

Thus, the logical value of the weight cell is determined by the two MTJ's 102 and 104. In Table 1, $V_r$ is defined as the read voltage and $I_r$ is defined as the read current, which is equal to $I_r=G_L V_r$. The read voltage should be small enough to eliminate read disturb.

TABLE 1

| Logical Input | $V_{in}/\overline{V_{in}}$ | Logical Weight | G | $\overline{G}$ | $I_{out}$ | $\overline{I_{out}}$ |
|---|---|---|---|---|---|---|
| 0 | 0 | 0 | $G_H$ | $G_L$ | 0 | 0 |
| 0 | 0 | 1 | $G_L$ | $G_H$ | 0 | 0 |
| 1 | $V_r$ | 0 | $G_H$ | $G_L$ | 0 | $I_r$ |
| 1 | $V_r$ | 1 | $G_L$ | $G_H$ | $I_r$ | 0 |

Figure 2:
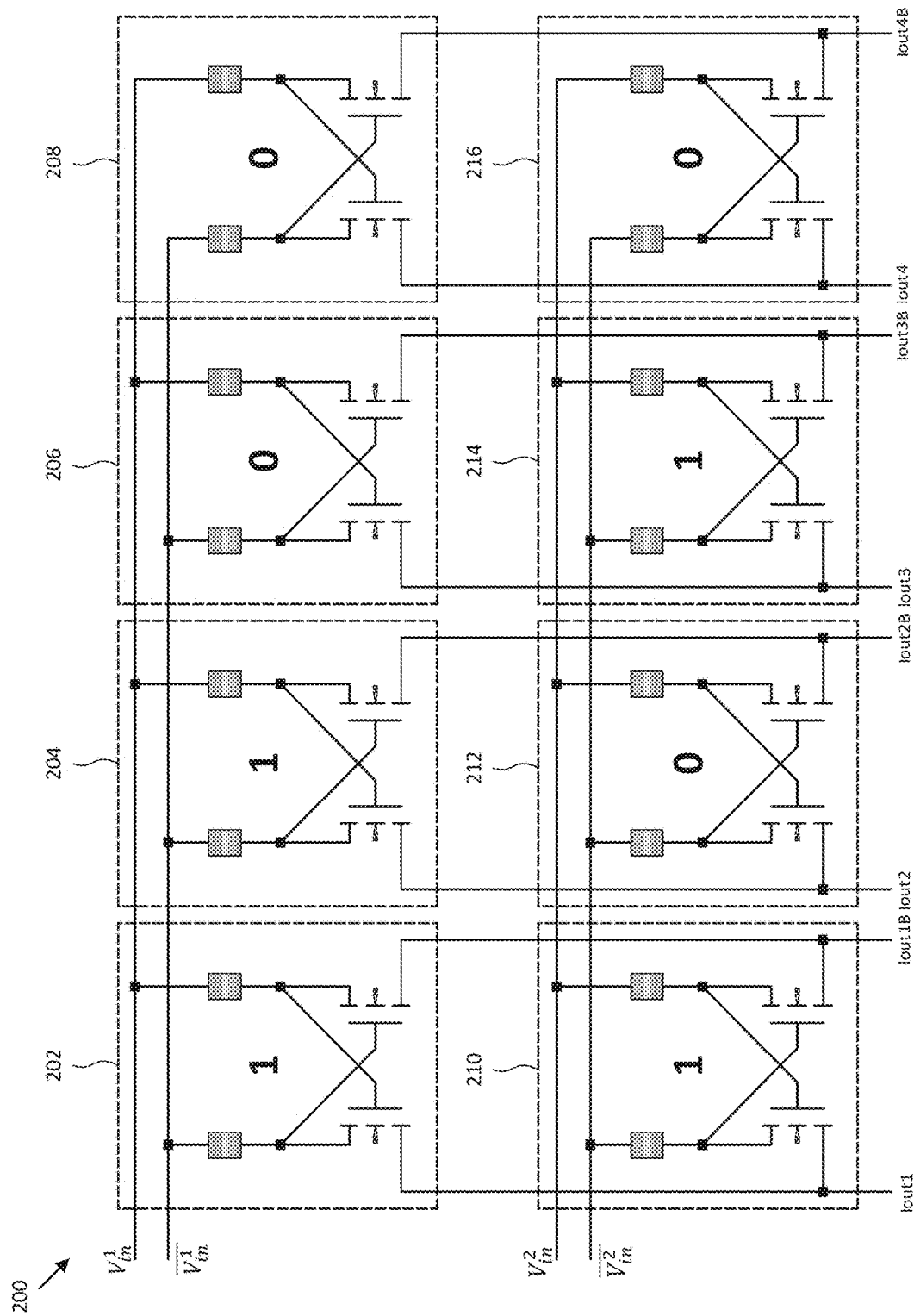
FIG. 2 illustrates a diagram of weight cell array, according to an embodiment.

FIG. 2 illustrates a diagram of a weight cell array 200, according to an embodiment. The array 200 includes weight cells 202-216. There are two lines, $V_{in}$ and $\overline{V_{in}}$, connected to each bitcell in a given row. There are two lines, $I_{out}$ and $\overline{I_{out}}$, connected to each bitcell in a given column. For each element in an input vector, a logical 1 or logical 0 is represented by setting $V_{in}$ and $\overline{V_{in}}$ lines in the row corresponding to that element to $V_r$ or holding at ground, respectively. For each weight cell, a logical 1 is set by programming the MTJ connected to the $I_{out}$ line to the low conductance state and the MTJ connected to the $\overline{I_{out}}$ line to the high conductance state. For each weight cell, a logical 0 is set by programming the MTJ connected to the $I_{out}$ line to the high conductance state and the MTJ connected to the $\overline{I_{out}}$ line to the low conductance state. Because of the large on/off ratio of the bitcell, the current on $I_{out}$ and $\overline{I_{out}}$ is dominated by the MTJ connected in series with the transistor that is on.

For each column, the outputs on $I_{out}$ and $\overline{I_{out}}$ are complementary with respect to the number of logical 1's in the input vector. If there is N logical 1's in the input vector, then $I_{out}+\overline{I\_out}=NI_{cell}$, where $I_r=G_L V_r$. If the number of bitcells in each column with a logical value of 1 corresponding to the subset of N rows of the input vector also have logical value of 1, in existing approaches, M is calculated from $I_{out}$ by noting that $M=I_{out}/I_{cell}$. It should be noted that M is the inner product of the input vector and the column. In the existing approach, $\overline{I_{out}}$ is ignored.

For the 2T-2MTJ bitcell, there are a two output lines $I_{out}$ and $\overline{I_{out}}$ as shown in FIG. 1. The bitcell is programmed to be either in a logical 1 or logical 0 state. When a read voltage, $V_r$, is applied to both input lines $V_{in}$ and $\overline{V_{in}}$, the bitcell generates a current, $I_{cell}$, on one output line and negligible leakage current on the other output line. If the bitcell is programmed into a logical 1 state, then $I_{cell}$ is added to the $I_{out}$ line and a neglible current is added to $\overline{I_{out}}$. Conversely, if the bitcell is programmed to a logical 0 state, then a negligible leakage current is added to $I_{out}$ and $I_{cell}$ is added to $\overline{I_{out}}$.

For an array of 2T-2MTJ bitcells (as shown in FIG. 2), analog bitwise vector-matrix multiplication may be performed through the network and then the output current can be converted to a digital value where the full multiplication is reconstructed digitally. A digital input vector is bit sliced in time so that the first the most significant bit (MSB) bit vector is processed, then the next MSB, and so on. To represent each element in a bit sliced input vector, a voltage is applied to the corresponding row in the array where a logical 1 is represented by applying $V_r$ to both $V_{in}$ and $\overline{V_{in}}$ for that row. A logical 0 is represented by grounding both the $V_{in}$ and $\overline{V_{in}}$ lines for that row. For a given bit sliced vector, the number of bitcells contributing a current $I_{cell}$ to the output line in a given column is equal to the inner product of the logical values of the input vector and the bitcells in that column. If the inner product is defined as M, then the total current on $I_{out}$ is $MI_{cell}$ (ignoring variation). The output current on the other line is also related to the inner product. For an input vector with N logical 1's, the number of cells contributing a current to $\overline{I_{out}}$ is equal to N−M such that the total current is $(N-M)I_{cell}$ (ignoring variation).

Taking variation of the on-state conductance of the bitcell into account, there is an appreciable loss in inference accuracy when these arrays are used for machine learning tasks. In order to mitigate the effects of variation, the outputs from both the $I_{out}$ and $\overline{I_{out}}$ lines are measured and then averaged. For each input vector, the number of logical 1's, N, must be known. It is fairly inexpensive to calculate this number digitally. Next, M is calculated independently on each line where $$M_{out} = \frac{I_{out}}{I_{cell}} \text{ and } M_{\overline{out}} = N - \frac{I_{\overline{out}}}{I_{cell}}.$$

A weighted average between the two values that reduces the variation is calculated as in Equation (1):

$$M=wM_{out}+\overline{w}M_{\overline{out}} \quad (1)$$

where w and $\overline{w}$ are the weights.

In the simplest scheme, taking the fixed average such that $w=\overline{w}=\frac{1}{2}$ results in the approximation as in Equation (2).

$$M_{avg}=\frac{1}{2}(M_{out}+M_{\overline{out}}) \quad (2)$$

Assuming the bitcell conductance variation is randomly distributed and independent (i.e., variation not correlated), then it can be shown that the following weights are optimal for minimizing variation:

$$w = \frac{(N-M)}{N} \text{ and } \overline{w} = \frac{M}{N}.$$

If the variation for the bitcells is not randomly distributed or independent, other equations for the weights may apply. This requires knowledge of M, which is the quantity being calculated. Therefore, some approximation may be applied to M, such as $M_{avg}$, so that the quantity can be calculated with minimal variation through Equation (3).

$$M_{opt} = \frac{(N-M_{avg})}{N}M_{out} + \frac{M_{avg}}{N}M_{\overline{out}} \quad (3)$$

To find the $M_{opt}$ with minimal variation, the weighted average of the measured M's is taken from the currents from $M_{out}$ and $M_{\overline{out}}$, as in Equation (4).

$$M_{opt}=wM_{out}+\overline{w}M_{\overline{out}} \quad (4)$$

The weights are calculated from the simple average of $M_{out}$ and $M_{\overline{out}}$, starting with the definition as in Equation (5).

$$M_{avg}=(M_{out}+M_{\overline{out}})/2 \quad (5)$$

From the previously discussed logic, the optimal weights for minimizing variation are as in Equations (6) and (7).

$$w = \frac{(N-M)}{N} \quad (6)$$

$$\overline{w} = \frac{M}{N} \quad (7)$$

Since M is the quantity being measured, $M_{avg}$ is used as an approximation as in Equations (8) and (9).

$$w=(N-M_{avg})/N \quad (8)$$

$$\overline{w}=M_{avg}/N \quad (9)$$

Substituting Equations (8) and (9) into Equation (4) produces Equation (10).

$$M_{opt} = \frac{(N-M_{avg})}{N}M_{out} + \frac{M_{avg}}{N}M_{\overline{out}} \quad (10)$$

Substituting the definition of $M_{avg}$ into Equation (10) produces Equation (11).

$$M_{opt}=(2N-M_{out}-M_{\overline{out}})(M_{out})/2N+(M_{\overline{out}})(M_{out}+M_{\overline{out}})/2N \quad (11)$$

Figure 3:
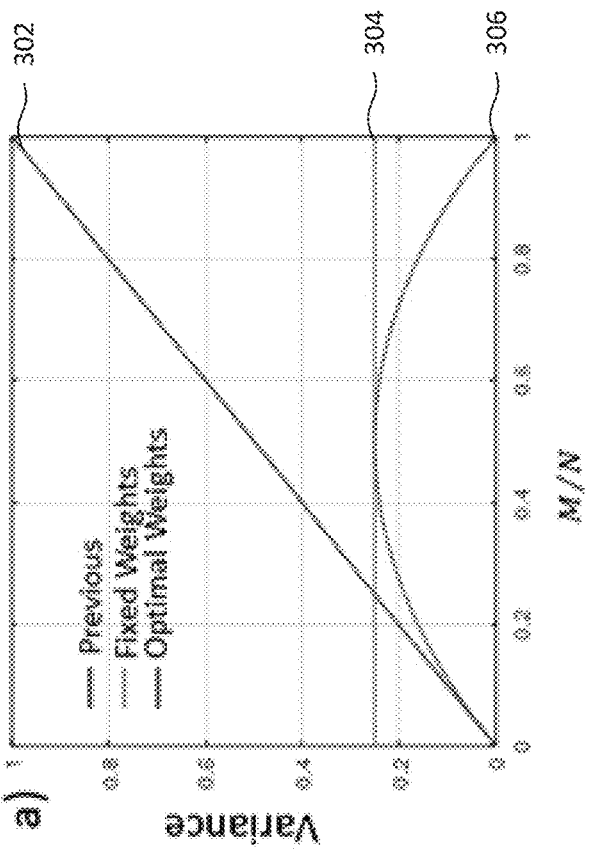
FIG. 3 illustrates a graph of variance based on weights, according to an embodiment.

FIG. 3 illustrates a graph of variance based on weights, according to an embodiment. Line 302 shows the variance of the total current measured based on previous processes. Line 304 shows the variance of the total current measured based on fixed weights. Line 306 shows the variance of the total current measured based on optimized weights.

Figure 4:
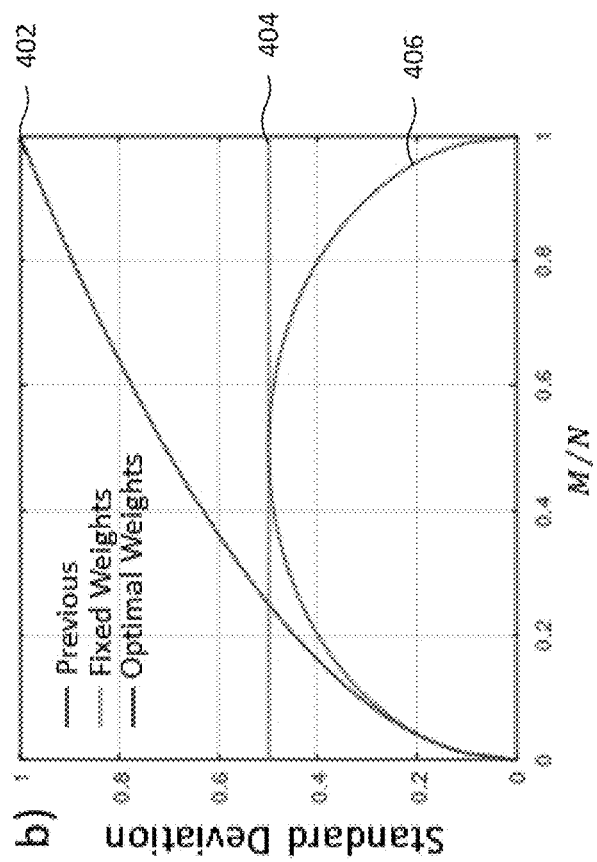
FIG. 4 illustrates a graph of standard deviation based on weights, according to an embodiment.

FIG. 4 illustrates a graph of standard deviation based on weights, according to an embodiment. Line 402 shows the standard deviation of the total current measured based on previous processes. Line 404 shows the standard deviation of the total current measured based on fixed weights. Line

406 shows the standard deviation of the total current measured based on optimized weights.

Referring to FIGS. 3 and 4, where the variance and standard deviation of the total current measured are shown as a function of $$\frac{M}{N},$$

the variance of the current on a given line increases linearly with the number of cells contributing a current to it. The variance does not depend on the fraction of logical 1's in the column amongst the subset of N rows that are activated by the input vector. By observing that the variance of the complementary $I_{\overline{out}}$ line is inversely proportional to M, the variation is minimized by taking the average between the two values. The provided systems and methods improve the variance without incurring additional area.

The read of $I_{out}$ and $I_{\overline{out}}$ could either be performed in parallel with different circuitry or in sequence with the same sense circuitry. One potential advantage for performing the sense on the same circuitry is that if there is any systematic static offset due to process variation, then the errors should largely cancel because any systematic error on $I_{out}$ that pushes the estimation of $M_{out}$ in one direction will necessarily push the estimation of $M_{\overline{out}}$ in the other direction. For example, if there is sense circuitry that systematically over-estimates the current, in the estimation of $M_{out}$, $I_{out}$ will be incorrectly read as slightly larger than it is and so $M_{out}$ will be slightly larger than the actual value. On the other hand, $I_{\overline{out}}$ will be erroneously be read slightly larger, but because $$M_{\overline{out}} = N - \frac{I_{\overline{out}}}{I_{cell}},$$

the estimate of $M_{\overline{out}}$ will be slightly smaller than the actual value and therefore the errors should somewhat cancel when $M_{out}$ and $M_{\overline{out}}$ are averaged.

The system and method provide a readout scheme for an array of 2T-2MTJ bit cells where the sum of logical 1's in the input feature vector, N, is calculated digitally and the output on each current line, $I_{out}$ and $I_{\overline{out}}$ are sensed and converted to digital values normed to the cell current, $I_{cell}$ and then the product of the input vector and the logical values of the bitcells in a given column, M, is calculated as the simple average as in Equation (12).

$$M_{avg} = 0.5\ ADC\left(\frac{I_{out}}{I_{cell}}\right) + 0.5\left[N - ADC\left(\frac{I_{\overline{out}}}{I_{cell}}\right)\right] \quad (12)$$

Alternatively, the simple average $M_{avg}$ may be used to find optimal weights as in Equation (13):

$$M_{avg} = w\ ADC\left(\frac{I_{out}}{I_{cell}}\right) + \overline{w}\left[N - ADC\left(\frac{I_{\overline{out}}}{I_{cell}}\right)\right] \quad (13)$$

where w and $\overline{w}$ are the optimal weights that minimize variation for a given N and $M_{avg}$. The formula for the optimal weights depends on the nature of the variation of the bitcells.

Furthermore, it may be assumed that the variation of the bitcells is random and independent, such that the optimal weights are taken as Equation (14).

$$w = \frac{(N-M)}{N} \text{ and } \overline{w} = \frac{M}{N} \quad (14)$$

The system and method provides minimal variance by sampling both output lines from a single column of 2T-2MTJ bit cells and does not require additional area/energy to be devoted to redundant columns to reduce variation. The present system and method may also be applied to other related bitcells including a 4T-4MTJ systems.

The system and method may leverage the complementary output on $I_{\overline{out}}$ in order to reduce the effect of MTJ conductance variation. The system may pre-calculate N (the number of logical 1s in the input vector. The system and method may guess M (the inner product of the logical values of the input vector and the bitcells in a column) from $I_{out}$ as in Equation (15).

$$M_{out} = ADC\left(\frac{I_{out}}{I_{cell}}\right) \quad (15)$$

The system and method may guess $M_{\overline{out}}$ from $I_{\overline{out}}$ as in Equation (16).

$$M_{\overline{out}} = N - ADC\left(\frac{I_{\overline{out}}}{I_{cell}}\right) \quad (16)$$

Given Equation (1), the weights w and $\overline{w}$ sum to unity. For example, $w = \overline{w} = \frac{1}{2}$ when weights are fixed, and $$w = \frac{(N-M)}{N} \text{ and } \overline{w} = \frac{M}{N}$$

when variance is minimized (i.e., optimization).

If the properties of the variation are known, then the system and method can optimize the weighted average to minimize $\sigma_M^2$ (variance of M). To approximate $\sigma_M^2$, it is assumed that there is random variation (the variance of the bitcell conductance is $\sigma_{cell}^2$ (std dev=$\sigma_{cell}$), the variation of bitcell conductances are independent, and the current and variation in the current through the off state transistor is negligible. In a previous process, M is calculated only from $I_{out}$ and $I_{\overline{out}}$ is ignored. In this case the variance is as in Equation (17).

$$\sigma_{M_{pre}}^2 = M\sigma_{cell}^2 \quad (17)$$

Using fixed weights, M can be calculated from $I_{out}$ and $I_{\overline{out}}$, as in Equation (18).

$$\sigma_{M_{fix}}^2 = \tfrac{1}{4} N \sigma_{cell}^2 \quad (18)$$

Using optimized weights, M can be calculated from $I_{out}$ and $I_{\overline{out}}$ as in Equation (19).

$$\sigma_{M_{opt}}^2 = \frac{M(N-M)}{N}\sigma_{cell}^2 \quad (19)$$

The variance depends on what fraction of the elements in the columns are logical 1's from the subset of N activated rows. For fixed weights, the variance is only reduced for $$\frac{M}{N} > 1/4.$$

For optimized weights, the variation is minimized for all M.

Figure 5:
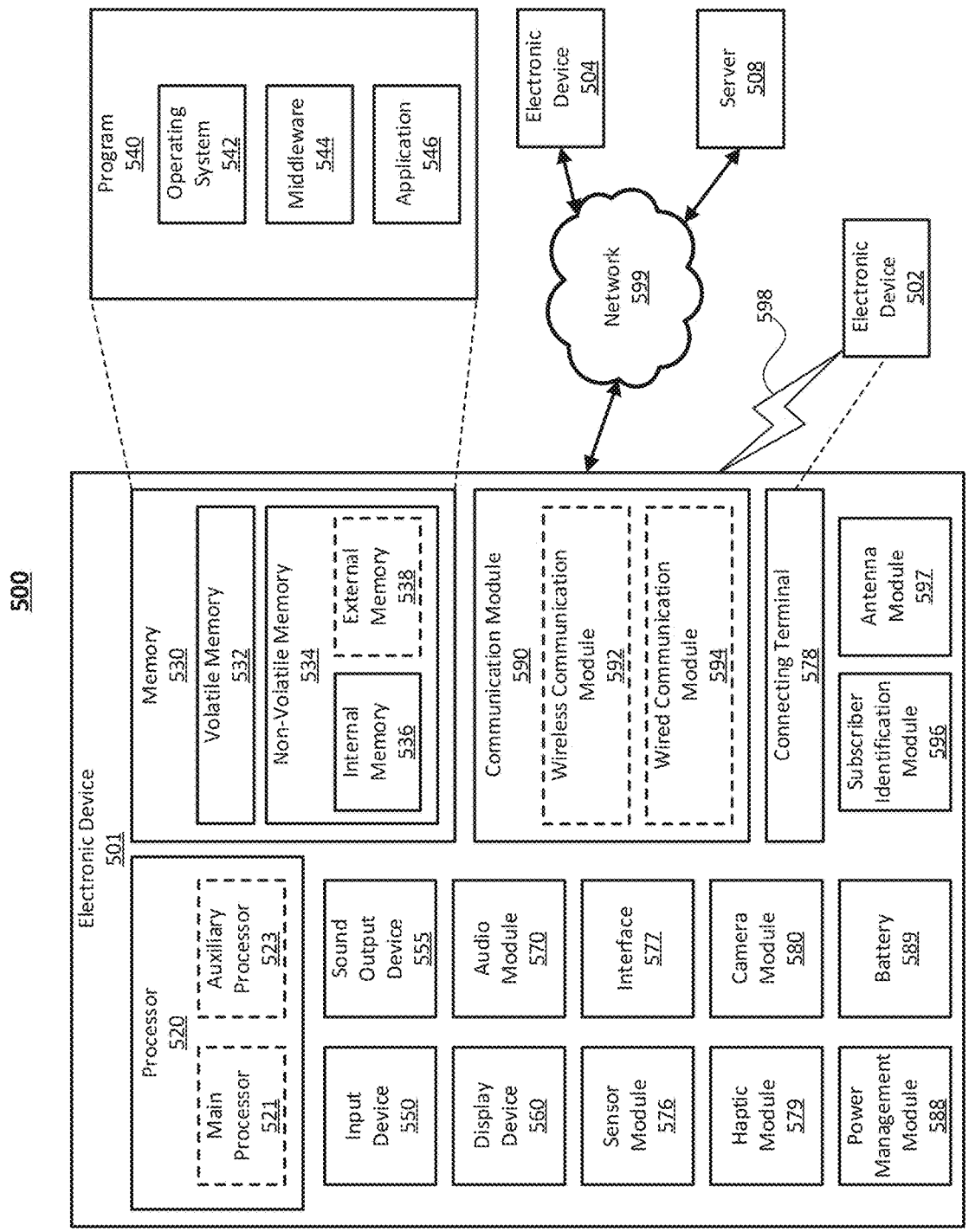
FIG. 5 illustrates a block diagram of an electronic device in a network environment, according to an embodiment.

FIG. 5 illustrates a block diagram of an electronic device 501 in a network environment 500, according to one embodiment. Referring to FIG. 5, the electronic device 501 in the network environment 500 may communicate with another electronic device 502 via a first network 598 (e.g., a short-range wireless communication network), or another electronic device 504 or a server 508 via a second network 599 (e.g., a long-range wireless communication network). The electronic device 501 may also communicate with the electronic device 504 via the server 508. The electronic device 501 may include a processor 520, a memory 530, an input device 550, a sound output device 555, a display device 560, an audio module 570, a sensor module 576, an interface 577, a haptic module 579, a camera module 580, a power management module 588, a battery 589, a communication module 590, a subscriber identification module (SIM) 596, or an antenna module 597. In one embodiment, at least one (e.g., the display device 560 or the camera module 580) of the components may be omitted from the electronic device 501, or one or more other components may be added to the electronic device 501. In one embodiment, some of the components may be implemented as a single integrated circuit (IC). For example, the sensor module 576 (e.g., a fingerprint sensor, an iris sensor, or an illuminance sensor) may be embedded in the display device 560 (e.g., a display).

The processor 520 may execute, for example, software (e.g., a program 540) to control at least one other component (e.g., a hardware or a software component) of the electronic device 501 coupled with the processor 520, and may perform various data processing or computations. As at least part of the data processing or computations, the processor 520 may load a command or data received from another component (e.g., the sensor module 576 or the communication module 590) in volatile memory 532, process the command or the data stored in the volatile memory 532, and store resulting data in non-volatile memory 534. The processor 520 may include a main processor 521 (e.g., a central processing unit (CPU) or an application processor (AP)), and an auxiliary processor 523 (e.g., a graphics processing unit (GPU), an image signal processor (ISP), a sensor hub processor, or a communication processor (CP)) that is operable independently from, or in conjunction with, the main processor 521. Additionally or alternatively, the auxiliary processor 523 may be adapted to consume less power than the main processor 521, or execute a particular function. The auxiliary processor 523 may be implemented as being separate from, or a part of, the main processor 521.

The auxiliary processor 523 may control at least some of the functions or states related to at least one component (e.g., the display device 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). According to one embodiment, the auxiliary processor 523 (e.g., an ISP or a CP) may be implemented as part of another component (e.g., the camera module 580 or the communication module 590) functionally related to the auxiliary processor 523.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534.

The program 540 may be stored in the memory 530 as software, and may include, for example, an operating system (OS) 542, middleware 544, or an application 546.

The input device 550 may receive a command or data to be used by other component (e.g., the processor 520) of the electronic device 501, from the outside (e.g., a user) of the electronic device 501. The input device 550 may include, for example, a microphone, a mouse, or a keyboard.

The sound output device 555 may output sound signals to the outside of the electronic device 501. The sound output device 555 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 560 may visually provide information to the outside (e.g., a user) of the electronic device 501. The display device 560 may include, for example, a display, a hologram device, or a projector and control circuitry to control a corresponding one of the display, hologram device, and projector. According to one embodiment, the display device 560 may include touch circuitry adapted to detect a touch, or sensor circuitry (e.g., a pressure sensor) adapted to measure the intensity of force incurred by the touch.

The audio module 570 may convert a sound into an electrical signal and vice versa. According to one embodiment, the audio module 570 may obtain the sound via the input device 550, or output the sound via the sound output device 555 or a headphone of an external electronic device 502 directly (e.g., wired) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. The sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device 502 directly (e.g., wired) or wirelessly. According to one embodiment, the interface 577 may include, for example, a high definition multimedia interface (HDMI), a universal serial bus (USB) interface, a secure digital (SD) card interface, or an audio interface.

A connecting terminal 578 may include a connector via which the electronic device 501 may be physically connected with the external electronic device 502. According to one embodiment, the connecting terminal 578 may include, for example, an HDMI connector, a USB connector, an SD card connector, or an audio connector (e.g., a headphone connector).

The haptic module 579 may convert an electrical signal into a mechanical stimulus (e.g., a vibration or a movement) or an electrical stimulus which may be recognized by a user via tactile sensation or kinesthetic sensation. According to one embodiment, the haptic module 579 may include, for example, a motor, a piezoelectric element, or an electrical stimulator.

The camera module 580 may capture a still image or moving images. According to one embodiment, the camera module 580 may include one or more lenses, image sensors, ISPs, or flashes.

The power management module 588 may manage power supplied to the electronic device 501. The power management module 588 may be implemented as at least part of, for example, a power management integrated circuit (PMIC).

The battery 589 may supply power to at least one component of the electronic device 501. According to one embodiment, the battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more CPs that are operable independently from the processor 520 (e.g., the AP) and supports a direct (e.g., wired) communication or a wireless communication. According to one embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or a standard of the Infrared Data Association (IrDA)) or the second network 599 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The antenna module 597 may transmit or receive a signal or power to or from the outside (e.g., the external electronic device) of the electronic device 501. According to one embodiment, the antenna module 597 may include one or more antennas, and, therefrom, at least one antenna appropriate for a communication scheme used in the communication network, such as the first network 598 or the second network 599, may be selected, for example, by the communication module 590 (e.g., the wireless communication module 592). The signal or the power may then be transmitted or received between the communication module 590 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 501 and the external electronic device 504 via the server 508 coupled with the second network 599. Each of the electronic devices 502 and 504 may be a device of a same type as, or a different type, from the electronic device 501. All or some of operations to be executed at the electronic device 501 may be executed at one or more of the external electronic devices 502, 504, or 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, or client-server computing technology may be used, for example.

One embodiment may be implemented as software (e.g., the program 540) including one or more instructions that are stored in a storage medium (e.g., internal memory 536 or external memory 538) that is readable by a machine (e.g., the electronic device 501). For example, a processor of the electronic device 501 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A method for mitigating variance in a two transistor two resistive memory element (2T2R) circuit, comprising:
   calculating, for an input vector, a sum, N, of a number of logical 1's in a column of bitcells in the 2T2R circuit;
   sensing output current values from each current line in the column of bitcells; and
   calculating an inner product, M, of the input vector and the bitcells in the column in the 2T2R circuit based on the sensed output current values,
   wherein the inner product is calculated using optimal weights that minimize variation of the input vector and the inner product.

2. The method of claim 1, wherein the inner product is calculated as a simple average, $M_{avg}$, according to $M_{avg}=(M_{out}+M_{\overline{out}})/2$, where $$M_{out} = \frac{I_{out}}{I_{cell}}, M_{\overline{out}} = N - \frac{I_{\overline{out}}}{I_{cell}},$$

$I_{cell}$ is a generated current, and $I_{out}$ and $\overline{I_{out}}$ are output lines from the 2T2R circuit.

3. The method of claim 1, wherein the two resistive memory elements of the 2T2R circuit comprise magnetic tunnel junction (MTJ) resistive memories.

4. The method of claim 1, wherein a variation of the bitcells in the column in the 2T2R circuit is random and independent.

5. The method of claim 1, wherein the inner product is calculated according to $$M_{avg} = w\, ADC\left(\frac{I_{out}}{I_{cell}}\right) + \overline{w}\left[N - ADC\left(\frac{\overline{I_{out}}}{I_{cell}}\right)\right],$$

where $I_{cell}$ is a generated current, $I_{out}$ and $\overline{I_{out}}$ are output lines from the 2T2R circuit, ADC is an analog to digital conversion coefficient, w and $\overline{w}$ are the optimal weights that minimize variation for N and a simple average, $M_{avg}$.

6. The method of claim 5, wherein the optimal weights w and $\overline{w}$ are given as $$w = \frac{(N-M)}{N} \text{ and } \overline{w} = \frac{M}{N},$$

where $M_{avg}$ is used to approximate M.

7. A system for mitigating variance, comprising:
   a two transistor two resistive memory element (2T2R) circuit including a column of bitcells and at least two output current lines;
   a processor; and
   a memory;
   configured to store computer-readable instructions, which when executed, control the processor to:
      calculate, for an input vector, a sum, N, of a number of logical 1's in the column of bitcells in the 2T2R circuit;
      sense output current values from the at least two output current lines in the column of bitcells; and
      calculate an inner product, M, of the input vector and the bitcells in the column in the 2T2R circuit based on the sensed output current values,
   wherein the inner product is calculated using optimal weights that minimize variation of the input vector and the inner product.

8. The system of claim 7, wherein the inner product is calculated as a simple average, $M_{avg}$, according to $M_{avg}=(M_{out}+M_{\overline{out}})/2$, where $$M_{out} = \frac{I_{out}}{I_{cell}}, M_{\overline{out}} = N - \frac{I_{\overline{out}}}{I_{cell}},$$

$I_{cell}$ is a generated current, and $I_{out}$ and $\overline{I_{out}}$ are output lines from the 2T2R circuit.

9. The system of claim 7, wherein the two resistive memory elements of the 2T2R circuit comprise magnetic tunnel junction (MTJ) resistive memories.

10. The system of claim 7, wherein a variation of the bitcells in the column in the 2T2R circuit is random and independent.

11. The system of claim 7, wherein the inner product is calculated according to $$M_{avg} = w\, ADC\left(\frac{I_{out}}{I_{cell}}\right) + \overline{w}\left[N - ADC\left(\frac{\overline{I_{out}}}{I_{cell}}\right)\right],$$

where $I_{cell}$ is a generated current, $I_{out}$ and $\overline{I_{out}}$ are output lines from the 2T2R circuit, ADC is an analog to digital conversion coefficient, w and $\overline{w}$ are the optimal weights that minimize variation for N and a simple average, $M_{avg}$.

12. The system of claim 11, wherein the optimal weights w and $\overline{w}$ are given as $$w = \frac{(N-M)}{N} \text{ and } \overline{w} = \frac{M}{N},$$

where $M_{avg}$ is used to approximate M.

13. An electronic device, comprising:
  a two transistor two resistive memory element (2T2R) circuit including a column of bitcells and at least two output current lines;
  a memory; and
  a processor configured to:
    calculate, for an input vector, a sum N of a number of logical 1's in the column of bitcells in the 2T2R circuit;
    sense output current values from the at least two output current lines in the column of bitcells; and
    calculate an inner product, M, of the input vector and the bitcells in the column in the 2T2R circuit based on the sensed output current values,
  wherein the inner product is calculated using optimal weights that minimize variation of the input vector and the inner product.

14. The electronic device of claim 13, wherein the inner product is calculated as a simple average, $M_{avg}$, according to $M_{avg}=(M_{out}+M_{\overline{out}})/2$,
  where $$M_{out} = \frac{I_{out}}{I_{cell}}, \quad M_{\overline{out}} = N - \frac{I_{\overline{out}}}{I_{cell}},$$

$I_{cell}$ is a generated current, and $I_{out}$ and $I_{\overline{out}}$ are output lines from the 2T2R circuit.

15. The electronic device of claim 14, wherein the two resistive memory elements of the 2T2R circuit comprise magnetic tunnel junction (MTJ) resistive memories.

16. The electronic device of claim 13, wherein a variation of the bitcells in the column in the 2T2R circuit is random and independent.

17. The electronic device of claim 13, wherein the inner product is calculated according to $$M_{avg} = w\, ADC\left(\frac{I_{out}}{I_{cell}}\right) + \overline{w}\left[N - ADC\left(\frac{I_{\overline{out}}}{I_{cell}}\right)\right],$$

where $I_{cell}$ is a generated current, $I_{out}$ and $I_{\overline{out}}$ are output lines from the 2T2R circuit, ADC is an analog to digital conversion coefficient, w and $\overline{w}$ are the optimal weights that minimize variation for N and a simple average, $M_{avg}$.

18. The electronic device of claim 17, wherein the optimal weights w and $\overline{w}$ are given as $$w = \frac{(N-M)}{N} \text{ and } \overline{w} = \frac{M}{N},$$

where $M_{avg}$ is used to approximate M.

* * * * *